(12) United States Patent
Katagiri et al.

(10) Patent No.: US 10,739,627 B2
(45) Date of Patent: Aug. 11, 2020

(54) DISPLAY DEVICE WITH FLEXIBLE SUBSTRATES

(71) Applicants: Panasonic Liquid Crystal Display Co., Ltd., Hyogo (JP); Pasona Knowledge Partner Inc., Osaka (JP)

(72) Inventors: Yusuke Katagiri, Hyogo (JP); Masaki Tsubokura, Hyogo (JP)

(73) Assignees: PANASONIC LIQUID CRYSTAL DISPLAY CO., LTD., Hyogo (JP); PASONA KNOWLEDGE PARTNER INC., Osaka (JP)

(*) Notice: Subject to any disclaimer, the term of this patent is extended or adjusted under 35 U.S.C. 154(b) by 28 days.

(21) Appl. No.: 15/927,365

(22) Filed: Mar. 21, 2018

(65) Prior Publication Data
US 2018/0275445 A1    Sep. 27, 2018

(30) Foreign Application Priority Data
Mar. 27, 2017    (JP) .................. 2017-061376

(51) Int. Cl.
| G02F 1/1333 | (2006.01) |
| H01L 27/12 | (2006.01) |
| H05K 1/18 | (2006.01) |
| G02F 1/1345 | (2006.01) |
| G02F 1/1347 | (2006.01) |
| H05K 1/14 | (2006.01) |

(52) U.S. Cl.
CPC .... *G02F 1/133305* (2013.01); *G02F 1/13452* (2013.01); *G02F 1/13454* (2013.01); *G02F 1/13471* (2013.01); *G02F 1/133308* (2013.01); *G02F 1/133345* (2013.01); *H01L 27/124* (2013.01); *H05K 1/189* (2013.01); *G02F 2001/13332* (2013.01); *G02F 2001/133317* (2013.01); *H05K 1/147* (2013.01); *H05K 2201/10136* (2013.01)

(58) Field of Classification Search
CPC ........ G02F 1/133305; G02F 1/133345; H05K 1/147; H05K 1/189; H05K 2201/042
See application file for complete search history.

(56) References Cited

U.S. PATENT DOCUMENTS

| 9,075,244 B2* | 7/2015 | Song ................. G02B 27/26 |
| 2009/0273743 A1 | 11/2009 | Sawabe et al. |
| 2015/0177527 A1* | 6/2015 | Park ................. G02B 27/2278 359/462 |

FOREIGN PATENT DOCUMENTS

| JP | 2004-212447 | 7/2004 |
| WO | 2007/040158 | 4/2007 |

* cited by examiner

*Primary Examiner* — Paisley L Wilson
(74) *Attorney, Agent, or Firm* — Hamre, Schumann, Mueller & Larson, P.C.

(57) ABSTRACT

A display device includes: a first display panel; a first flexible substrate on which a first driver IC outputting a driving signal to the first display panel is mounted; a second flexible substrate being apart from the first flexible substrate, at least a part of the second flexible substrate overlapping the first flexible substrate; and an insulating material disposed between the first flexible substrate and the second flexible substrate. The first flexible substrate is connected to the first display panel so that the first driver IC is on a side of the second flexible substrate. The insulating material is disposed between the first driver IC and the second flexible substrate.

16 Claims, 10 Drawing Sheets

DISPLAY DEVICE WITH FLEXIBLE SUBSTRATES

CROSS-REFERENCE TO RELATED APPLICATION

This application claims priority from Japanese application JP 2017-061376, filed Mar. 27, 2017. This Japanese application is incorporated herein by reference.

TECHNICAL FIELD

The present invention relates to a display device.

BACKGROUND

A display device includes liquid crystal display device. A flexible print circuit board on which driver ICs are mounted is connected to the display device. The driver ICs output drive signals in order to display an image.

A technology, in which two display panels overlap each other is conventionally proposed to improve contrast of a liquid crystal display device (for example, see WO 2007/040158). For example, WO 2007/040158 discloses that a color image is displayed on a first display panel, and a monochrome image is displayed on a second display panel, thereby improving contrast.

SUMMARY

In the display device in which two display panels overlap each other, two flexible print circuit boards which are respectively connected to the two display panels, could overlap each other. In this case, a driver IC mounted on one flexible print circuit board contacts with a surface of the other flexible print circuit board, or contacts a driver IC mounted on the other flexible print circuit board. Thereby, the other flexible print circuit board could be disconnected or both driver ICs could be damaged.

The present disclosure provides a display device that can prevent a flexible print circuit board from being disconnected by a driver IC mounted on the other flexible print circuit board, or prevent driver ICs respectively mounted on two flexible print circuit boards from damaged, even if two flexible print circuit boards overlap each other.

To solve the above problem, a display device according to a present disclosure comprises: a first display panel; a first flexible substrate on which a first driver IC outputting a driving signal to the first display panel is mounted; a second flexible substrate being apart from the first flexible substrate, at least a part of the second flexible substrate overlapping the first flexible substrate; and a compressible insulating material disposed between the first flexible substrate and the second flexible substrate. The first flexible substrate is connected to the first display panel so that the first driver IC is on a side of the second flexible substrate, and the insulating material is disposed between the first driver IC and the second flexible substrate.

The display device according to the present disclosure can prevent a flexible print circuit board from being disconnected by a driver IC mounted on the other flexible print circuit board, or prevent both driver ICs respectively mounted on two flexible print circuit boards from damaged, even if two flexible print circuit boards overlap each other.

DETAILED DESCRIPTION

The following describes an exemplary embodiment of the present disclosure. The embodiment described below is merely one specific example of the present disclosure. The numerical values, shapes, materials, elements, and arrangement and connection of the elements, etc. indicated in the following embodiment are given merely by way of illustration and are not intended to limit the present disclosure. Therefore, among elements in the following embodiment, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Note that in this specification and drawings, X-axis, Y-axis and Z-axis represents three-dimensional coordinates and are orthogonal to each other.

EMBODIMENT

Figure 1:
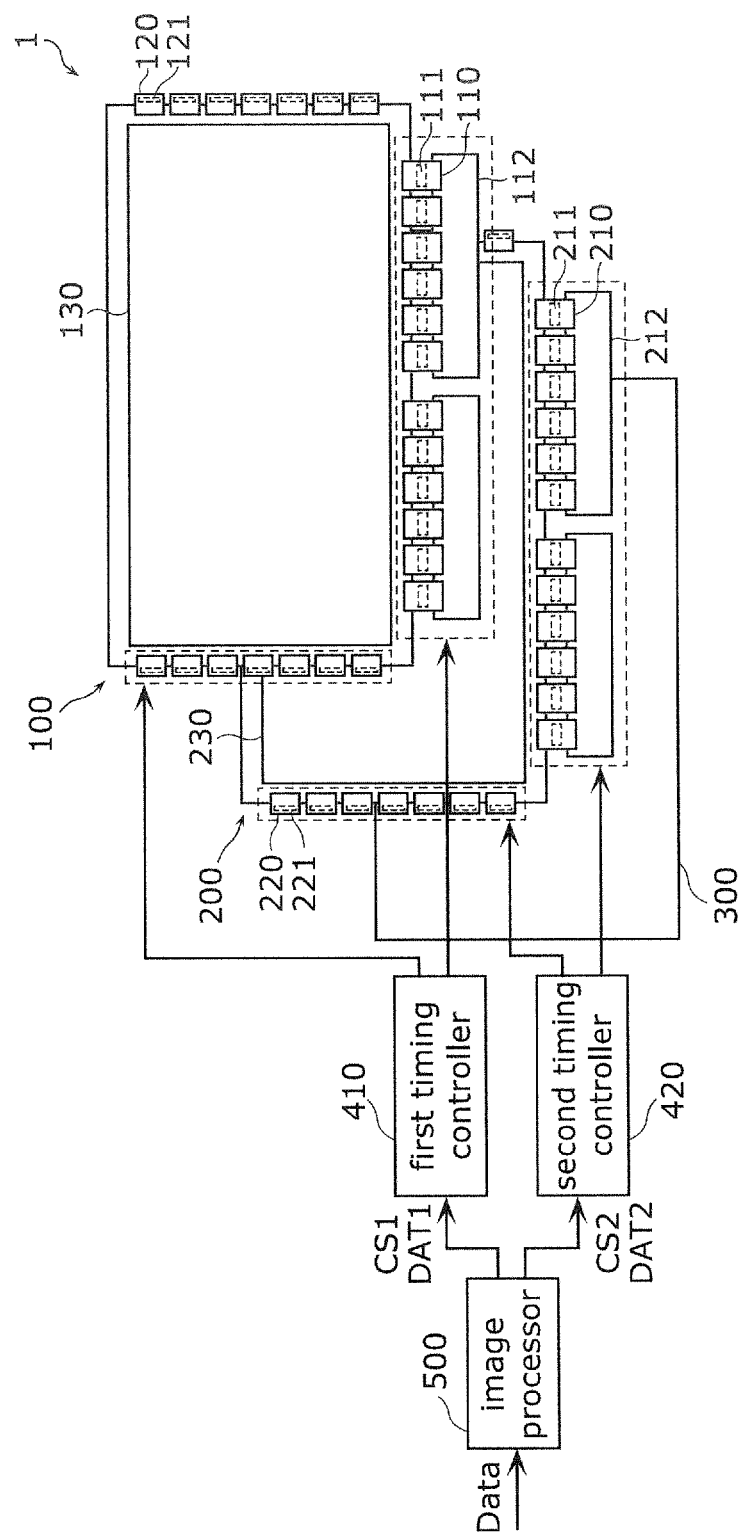
FIG. 1 is a view illustrating a schematic configuration of a display device according to the present exemplary embodiment.
Figure 2:
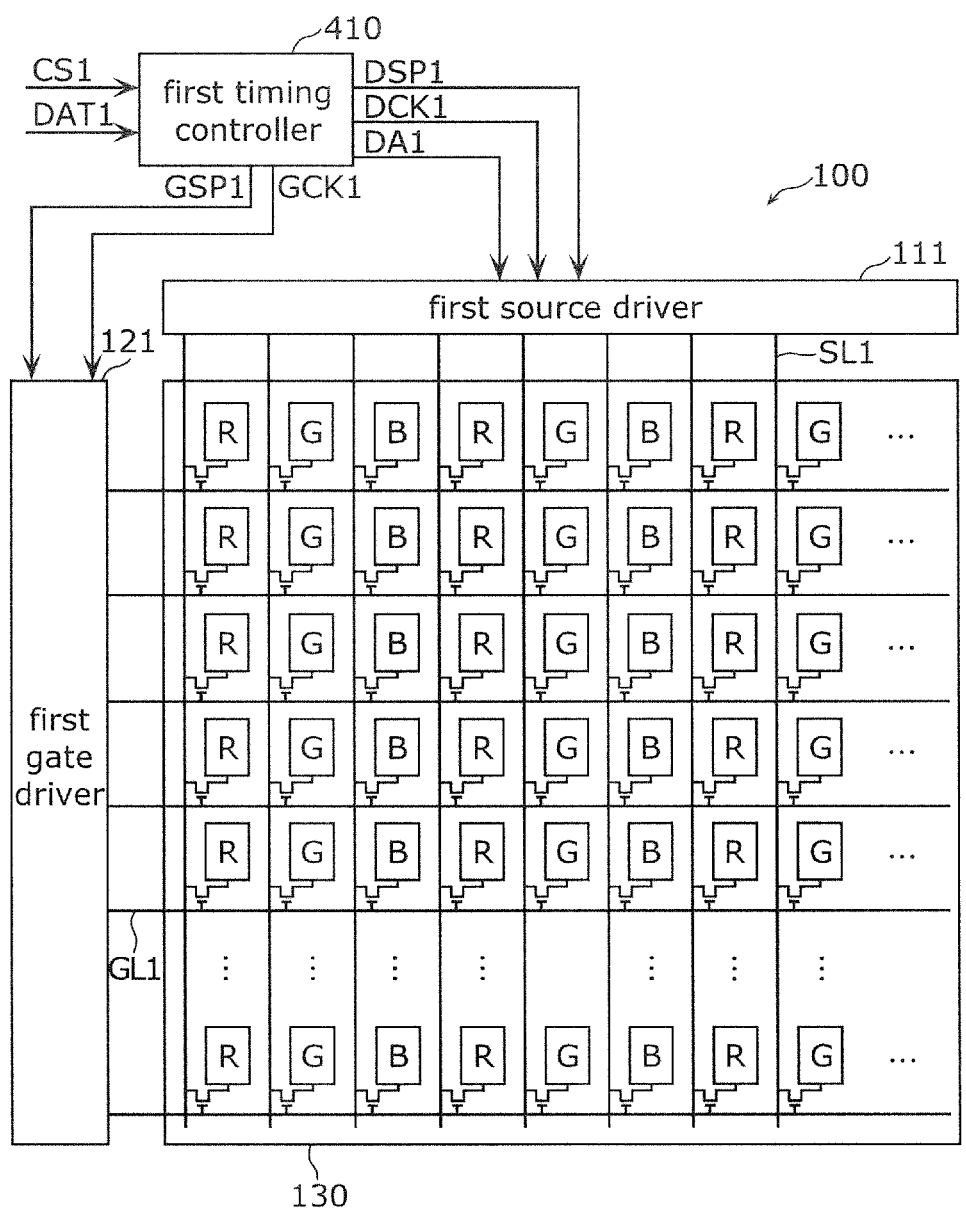
FIG. 2 is a view illustrating a schematic configuration of a first display panel of the display device according to the present exemplary embodiment.
Figure 3:
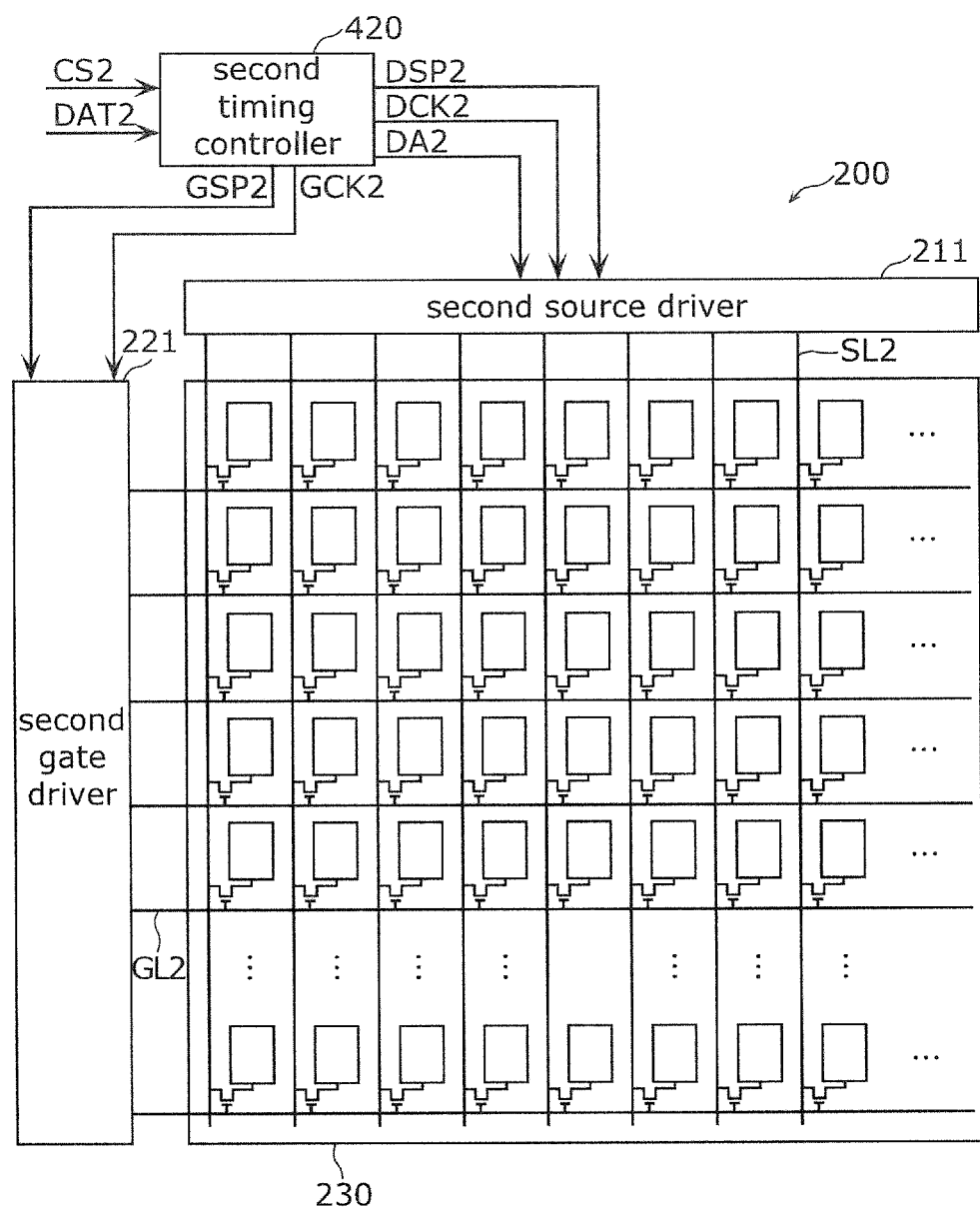
FIG. 3 is a view illustrating a schematic configuration of a second display panel of the display device according to the present exemplary embodiment.

Initially, an overall configuration of a display device 1 according to an exemplary embodiment of the present disclosure is described, with reference to FIGS. 1-3. FIG. 1 is a view illustrating a schematic configuration of the display device 1 according to the present exemplary embodiment. FIG. 2 is a view illustrating a schematic configuration of a first display panel 100 of the liquid crystal display 1. FIG. 3 is a view illustrating a schematic configuration of a second display panel 200 of the display device 1.

The display device 1 is one example of an image display device for displaying still images or moving images (videos). As illustrated in FIG. 1, the display device 1 includes a first display panel 100 disposed closer to an observer (front side), and second display panel 200 disposed closer to a backlight (rear side) than first display panel 100 is. Although the first display panel 100 and the second display panel 200 may have same shapes of contours in planer view, it is also acceptable that the first display panel 100 and the second display panel 200 may have different shapes of contours.

The first display panel 100 is a main panel and displays an image which is viewed by a user. In the present exemplary embodiment, the first display panel 100 displays a color image.

A first source FPC (flexible print circuit) 110 and a first gate FPC 120 relevant to first flexible substrates are connected to the first display panel 100. The first source FPC 110 and the first gate FPC 120 are connected to terminals of the first display panel 100 through for example anisotropic conductive films.

The first source FPC 110 is a flexible print circuit on which a first source driver 111 is mounted. The flexible print circuit is a flexible film substrate which has a conductive pattern (metal lines) made of metal such as a thin copper film is formed on a substrate made of an insulating resin material such as a polyimide material. The first source driver 111 is an IC chip including a plurality of ICs, and is mounted on the first source FPC 110 by means of COF (Chip On Flex) technology.

In this exemplary embodiment, twelve first source FPCs 110 are provided along a long edge of the first display panel 100. Each of twelve first source FPCs 110 is provided with a corresponding one first source driver 111. The number of the first source FPC 110 is not limited to twelve.

A first circuit board 112 is connected to an end of the first source FPC 110 opposing to an end closer to the first display panel 100. The first circuit board 112 is electrically connected to the first display panel 100 through the first source FPC 110. The first circuit board 112 is a printed circuit board having a rectangular shape. A plurality of electric parts are mounted on the first circuit board 112. The first circuit board 112 sends various signals output from a first timing controller 410, to the first source driver 111 of the first source FPC 110. In this exemplary embodiment, one first circuit board 112 is connected to six first source FPCs 110. That is to say, there are two first circuit boards 112. The number of the first circuit board 112 is not limited to two.

The first gate FPC 120 is a flexible print circuit on which a first gate driver 121 is mounted. The first gate driver 121 is an IC chip including a plurality of ICs, and is mounted on the first gate FPC 120 by means of COF (Chip On Flex) technology.

In this exemplary embodiment, seven first gate FPCs 120 are respectively provided along a pair of short edges of the first display panel 100. Each of total fourteen first gate FPC 120 is provided with a corresponding one first gate driver 121. The number of the first gate FPC 120 is not limited to fourteen.

Thus, the first source driver 111 and the first gate driver 121 relevant to first driver ICs outputting drive signals to the first display panel 100 are mounted on the first source FPC 110 and the first gate FPC 120 respectively.

When a color image is displayed on a first image display area 130 of the first display panel 100, various signals, which are output from a first timing controller 410, are input to the first source driver 111 and the first gate driver 121. Incidentally, various signals are input to the first source driver 111 through the first circuit board 112.

The second display panel 200 is a sub panel disposed in a rear side of the first display panel 100. The second display panel 200 displays a monochrome image (black and White image) corresponding to the color image displayed on the first display panel 100, in synchronization with the color image.

A second source FPC 210 and a second gate FPC 220 relevant to second flexible substrates are connected to the second display panel 200. The second source FPC 210 and the second gate FPC 220 are connected to terminals of the second display panel 200 through for example anisotropic conductive films.

The second source FPC 210 is a flexible print circuit on which a second source driver 211 is mounted. The second source driver 211 is an IC chip including a plurality of ICs, and is mounted on the second source FPC 210 by means of COF (Chip On Flex) technology.

In this exemplary embodiment, twelve second source FPCs 210 are provided along a long edge of the second display panel 200. Each of twelve second source FPCs 210 is provided with a corresponding one second source driver 211. The number of the second source FPC 210 is not limited to twelve.

A second circuit board 212 is connected to an end of the second source FPC 210 opposing to an end closer to the second display panel 200. The second circuit board 212 is electrically connected to the second display panel 200 through the second source FPC 210. The second circuit board 212 is a printed circuit board having a rectangular shape. A plurality of electric parts are mounted on the second circuit board 212. The second circuit board 212 sends various signals output from a second timing controller 420, to the second source driver 211 of the second source FPC 210. In this exemplary embodiment, one second circuit board 212 is connected to six second source FPC 210. That is to say, there are two second circuit boards 212. The number of the second circuit board 212 is not limited to two.

The second gate FPC 220 is a flexible print circuit on which a second gate driver 221 is mounted. The second gate driver 221 is an IC chip including a plurality of ICs, and is mounted on the second gate FPC 220 by means of COF (Chip On Flex) technology.

In this exemplary embodiment, seven second gate FPC 220 are respectively provided along a pair of short edges of the second display panel 200. Each of total fourteen second gate FPC 220 is provided with a corresponding one second source driver 211. The number of the second gate FPC 220 is not limited to fourteen.

Thus, the second source driver 211 and the second gate driver 221 relevant to second driver IC outputting drive signals to the second display panel 200 are mounted on the second source FPC 210 and the second gate FPC 220 respectively.

When a monochrome image is displayed on a second image display area 230 of the second display panel 200, various signals, which are output from a second timing controller 420, are input to the second source driver 211 and the second gate driver 221. Incidentally, various signals are input to the the second source driver 211 through the second circuit board 212.

As illustrated in FIGS. 2-3, the first image display area 130 and the second image display area 230 are composed of a plurality of pixels arranged in a matrix. The number of pixels included in the first image display area 130 and the number of pixels included in the second image display area 230 may be the same or may not be the same. For example, the first image display area 130 of the first display panel 100, which is a main panel, includes a greater number of pixels than the second image display area 230 of the second display panel 200, which is a sub panel.

In this exemplary embodiment, the display device 1 is a liquid crystal display device, and the first display panel 100 and the second display panel 200 are liquid crystal display panels. Drive schemes for the first display panel 100 and the second display panel 200 are, but not limited to, for example lateral electrical field types such as in-plane switching (IPS)

or fringe field switching (FFS). The drive schemes may be vertical alignment (VA) or twisted nematic (TN), for example.

The display device 1 further includes a backlight 300. The backlight 300 is disposed on a rear side of the second display panel 200.

The backlight 300 emits light to the first display panel 100 and the second display panel 200. For example, the backlight 300 is an LED backlight which includes a light emitting diode (LED) as a light source. However, the backlight 300 is not limited thereto.

The display device 1 includes the first timing controller 410 that controls the first source driver 111 and the first gate driver 121 of the first display panel 100, the second timing controller 420 that controls the second source driver 211 and the second gate driver 221 of the second display panel 200, and an image processor 500 that outputs image data to the first timing controller 410 and the second timing controller 420.

As illustrated in FIG. 2, based on first image data DAT1 and a first control signal CS1 (such as a clock signal, a vertical synchronizing signal, or a horizontal synchronizing signal), which are output from the image processor 500, the first timing controller 410 generates a first image data signal DA1 and various timing signals (data start pulse DSP1, data clock DCK1, gate start pulse GSP1, and gate clock GCK1) to control the first source driver 111 and the first gate driver 121. The first timing controller 410 outputs first image data DA1, a data start pulse DSP1, and a data clock DCK1 to the first source driver 111, and outputs a gate start pulse GSP1 and a gate clock GCK1 to the first gate driver 121.

The first source driver 111 outputs a data signal (data voltage) corresponding to the first image data DA1 to source lines SL1 of the first display panel 100 based on the data start pulse DSP1 and the data clock DCK1. The first gate driver 121 outputs a gate signal (gate voltage) to gate lines GL1 of the first display panel 100 based on the gate start pulse GSP1 and the gate clock GCK1.

As illustrated in FIG. 3, based on second image data DAT2 and a second control signal CS2 (such as a clock signal, a vertical synchronizing signal, or a horizontal synchronizing signal), which are output from the image processor 500, the second timing controller 420 generates a second image data signal DA1 and various timing signals (data start pulse DSP2, data clock DCK2, gate start pulse GSP2, and gate clock GCK2) to control the second source driver 211 and the second gate driver 221. The second timing controller 420 outputs second image data DA2, a data start pulse DSP2, and a data clock DCK2 to the second source driver 211, and outputs a gate start pulse GSP2 and a gate clock GCK2 to the second gate driver 221.

The second source driver 211 outputs a data signal (data voltage) corresponding to the second image data DA2 to source lines SL2 of the second display panel 200 based on the data start pulse DSP2 and the data clock DCK2. The second gate driver 221 outputs a gate signal (gate voltage) to gate lines GL2 of the second display panel 200 based on the gate start pulse GSP2 and the gate clock GCK2.

As illustrated in FIG. 1, the image processor 500 receives an input video signal Data transmitted from an external system (not illustrated), performs predetermined image processing on the input video signal Data, outputs the first image data DAT1 to the first timing controller 410, and outputs the second image data DAT2 to the second timing controller 420. The first image data DAT1 is image data for displaying the color image, and the second image data DAT2 is image data for displaying the monochrome image.

The image processor 500 also outputs the first control signal CS1 to the first timing controller 410 and outputs the second control signal CS2 to the second timing controller 420. The first control signal CS1 and the second control signal CS2 includes synchronizing signal to synchronize the color image displayed on the first display panel 100 and the monochrome image displayed on the second display panel 200.

In the display device 1 according to this exemplary embodiment, the image is displayed while two display panels of the first display panel 100 and the second display panel 200 overlap each other, so that black can be faithfully reproduced. Therefore, the image having high contrast ratio can be displayed. For example, the display device 1 is a high dynamic range (HDR) compatible television, and a local dimming compatible direct under type LED backlight may be used as backlight BL. In this case, the color image having high contrast ratio and higher image quality can be displayed.

Figure 4:
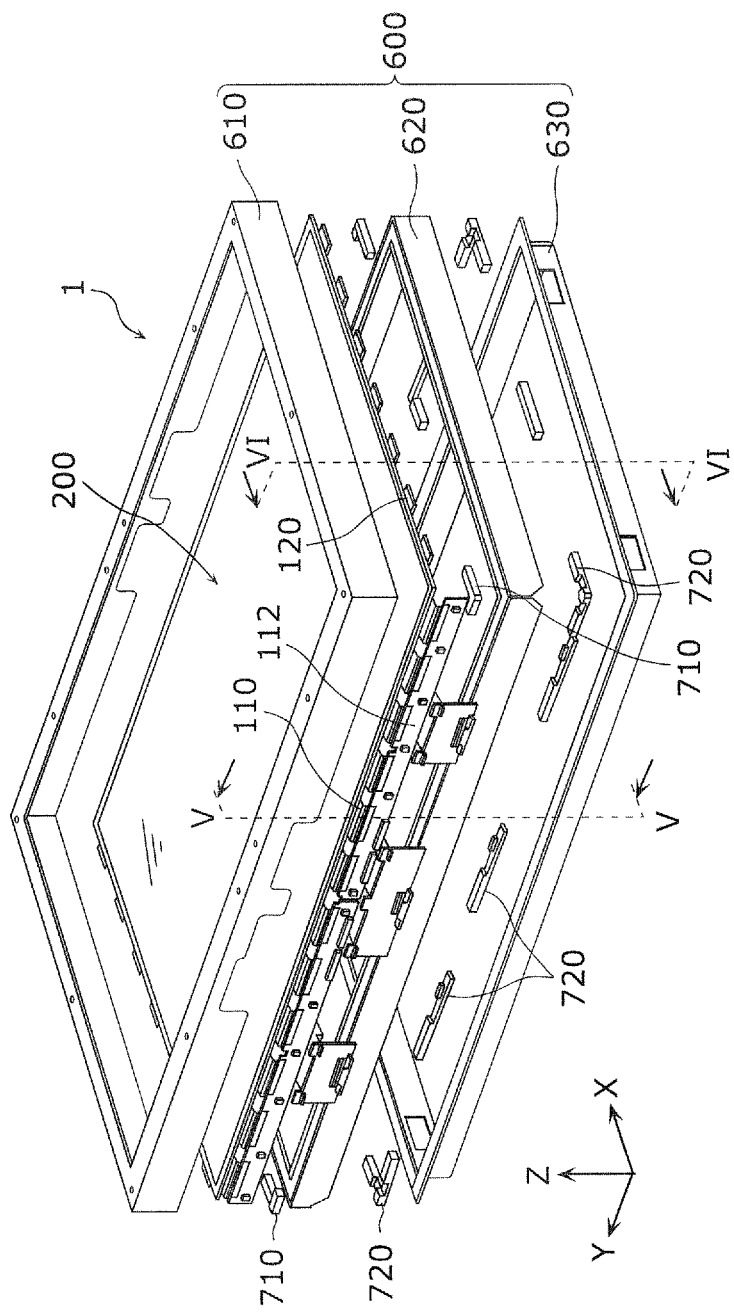
FIG. 4 is an exploded perspective view of the liquid crystal display device according to the present exemplary embodiment.
Figure 5:
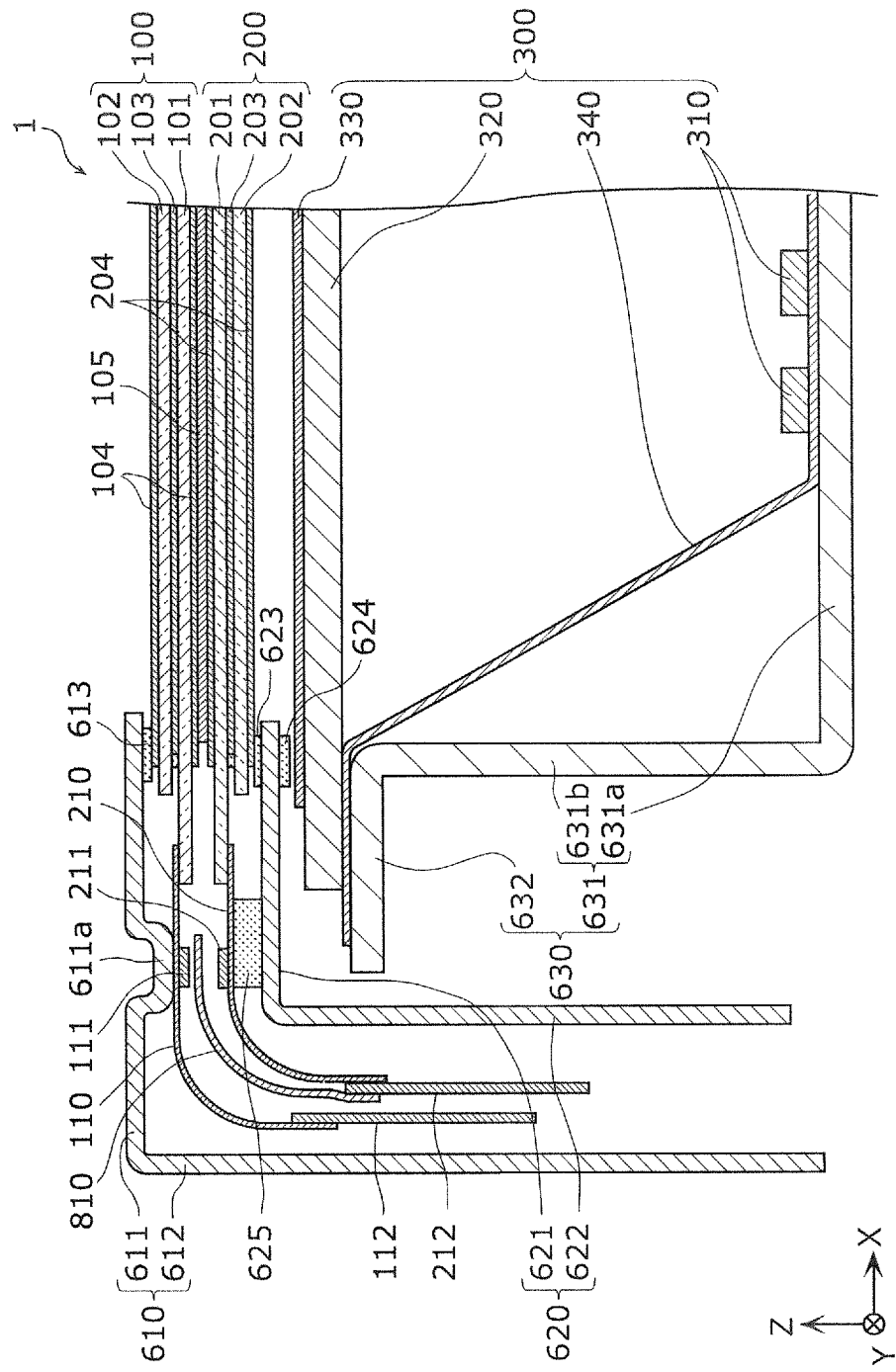
FIG. 5 is a partially sectional view taken along line V-V in FIG. 4.
Figure 6:
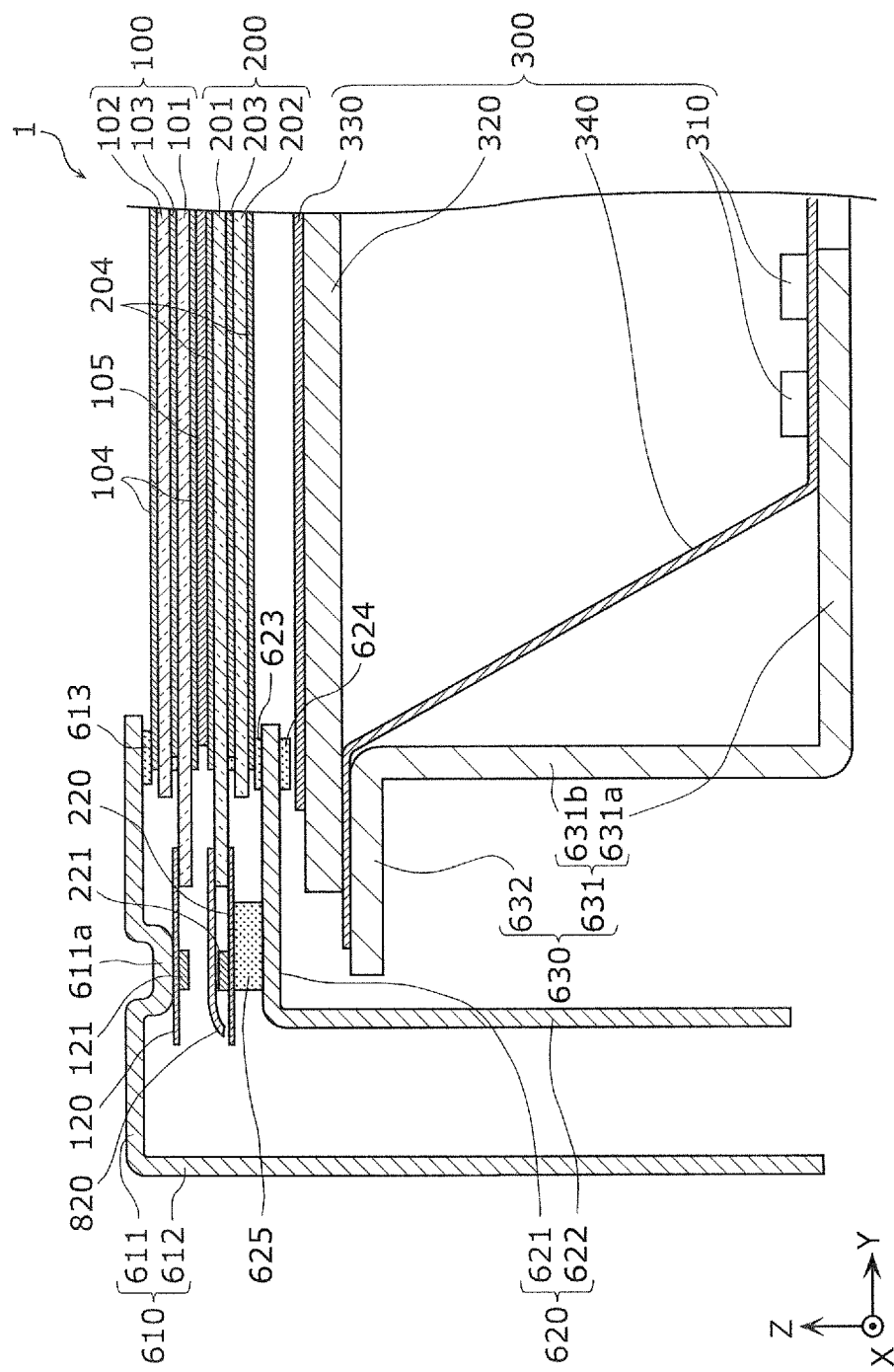
FIG. 6 is a partially sectional view taken along line VI-VI in FIG. 4.

FIG. 4 is an exploded perspective view of the liquid crystal display device 1 according to the present exemplary embodiment. FIG. 5 is a partially sectional view taken along line V-V in FIG. 4. FIG. 6 is a partially sectional view taken along line VI-VI in FIG. 4.

As illustrated in FIGS. 4-6, the display device 1 includes a frame 600 retaining the first display panel 100, the second display panel 200 and the backlight 300. The frame 600 consists of the upper frame 610, the middle frame 620 and the lower frame 630.

In the display device 1, the upper frame 610, the first display panel 100, the second display panel 200, the middle frame 620 and the lower frame 630 are separately disposed in this order from the observer side. Note that the first display panel 100 and the backlight 300 is not shown in FIG. 4 in order to make understood easily.

As illustrated in FIGS. 5-6, the first display panel 100 is a liquid crystal cell which includes a first thin-film-transistor substrate 101 (hereinafter, referred to as a TFT substrate), a first opposed substrate 102 being opposite to the first TFT substrate 101, and a first liquid crystal layer 103 disposed between the first TFT substrate 101 and the first opposed substrate 102. The first opposed substrate 102 is closer to observer side than the first TFT substrate 101 is.

The first TFT substrate 101 is a substrate in which a TFT layer is formed on a transparent substrate such as a glass substrate. The TFT layer includes a driving circuit, and is provided with TFTs and lines for driving the TFTs. Pixel electrodes for applying a voltage to the first liquid crystal layer 103 are formed on a flattening layer of the TFT layer.

The first opposed substrate 102 is a CF substrate in which color filters as pixel forming layer are formed on a transparent substrate such as a glass substrate. The pixel forming layer of the first opposed substrate 102 includes a black matrix and color filters. The black matrix is formed into a lattice shape or a stripe shape. A plurality of openings corresponding to pixels are formed in the black matrix. The color filters are provided in corresponding one of the openings of the black matrix. The color filters include a red color filter, a green color filter and a blue color filter. Each colored color filter corresponds to pixels.

The first liquid crystal layer 103 is sealed between the first TFT substrate 101 and the first opposed substrate 102. A liquid crystal molecule of the first liquid crystal layer 103 is selected in accordance with a drive method.

The second display panel 200 is a liquid crystal cell which includes a second TFT substrate 201, a second opposed substrate 202 being opposite to the second TFT substrate 201, and a second liquid crystal layer 203 disposed between the second TFT substrate 201 and the second opposed substrate 202. The second TFT substrate 201 is closer to observer side (the first display panel 100) than the second opposed substrate 202 is.

As illustrated in FIGS. 5-6, the second display panel 200 is disposed such that TFT substrate and opposed substrate are inverted compared to the first display panel 100. Specifically, the first TFT substrate 101 of the first display panel 100 and the second TFT substrate 201 of the second display panel 200 are opposed to each other.

The second TFT substrate 201 is a substrate in which a TFT layer is formed on a transparent substrate such as a glass substrate. The TFT layer includes a driving circuit, and is provided with TFTs and lines for driving the TFTs. Pixel electrodes for applying a voltage to the second liquid crystal layer 203 are formed on a flattening layer of the TFT layer.

The second opposed substrate 202 is a substrate in which pixel forming layer are formed on a transparent substrate such as a glass substrate. The pixel forming layer of the second opposed substrate 202 includes a black matrix. The black matrix is formed into a lattice shape or a stripe shape. In this exemplary embodiment, the pixel forming layer of the second opposed substrate 202 does not include any color filter since the second display panel 200 displays a monochrome image.

The second liquid crystal layer 203 is sealed between the second TFT substrate 201 and the second opposed substrate 202. A liquid crystal molecule of the second liquid crystal layer 203 is selected in accordance with a drive method.

A pair of the first polarizers 104 is attached to both sides of the first display panel 100 respectively. The pair of the first polarizers 104 is disposed such that a crossed Nicol positional relationship holds. That is, absorption axes (polarization axes) of the pair of the first polarizers 104 are substantially orthogonal to each other.

A pair of the second polarizers 204 is attached to both sides of the second display panel 200 respectively. The pair of the second polarizers 204 is disposed such that a crossed Nicol positional relationship holds. That is, absorption axes (polarization axes) of the pair of the second polarizers 204 are substantially orthogonal to each other. Also, phase difference films (retardation films) may be attached to the first polarizer 104 and the second polarizer 204 as needed.

The first display panel 100 and the second display panel 200 adhere to each other by the adhesive layer 105. Specifically, a first polarizer 104 disposed closer to the backlight 300 and a second polarizer 204 disposed closer to observers adhere by the adhesive layer 105. For example, a transparent adhesive material such as an optically clear adhesive (OCA) is used as the adhesive layer 105. Note that diffusion sheet may be disposed between the first display panel 100 and the second display panel 200.

The backlight 300 includes a plurality of LEDs 310, a transparent substrate 320, an optical sheet 330 and the reflective plate 340.

For example, the LEDs 310 are light emitting diodes (LED). For example, white LED emitting white light can be used as the LED 310.

In this exemplary embodiment, backlight BL is of a direct under type. Specifically, the plurality of LEDs 310 are arrayed on a bottom part of a lower frame 630. In this illustrated examples, the plurality of LEDs 310 are arrayed on a bottom surface of a reflective plate 340 disposed in a recess of a lower frame 630.

The transparent substrate 320 is for example a rigid plate having a light transmitting characteristic.

The transparent substrate 320 is opposed to a body 631 of the lower frame 630. Specifically, the transparent substrate 320 faces a bottom plate 631a of the body 631. A peripheral edge of the transparent substrate 320 is placed between a lower flange 632 of the lower frame 630 and a middle flange 621 of the middle frame 620. In this exemplary embodiment, the peripheral edge of the transparent substrate 320 is supported by the lower flange 632 of the lower frame 630. Specifically, the peripheral edge of the transparent substrate 320 is placed on a flange of the reflective plate 340 placed on the lower flange 632.

Note that the transparent substrate 320 may have a light diffusing characteristic. In this case, light entering the transparent substrate 320 pass the transparent substrate 320 while being diffused.

The optical sheet 330 is disposed in front of the plurality of the LEDs 310. That is, the optical sheet 330 is disposed in a light exiting side of the plurality of the LEDs 310. The optical sheet 330 is laminated on a front surface of the transparent substrate 320. The number of the optical sheet 330 may be one or more. For example, a diffusing sheet and/or a prism sheet which are diffusing lights from the LEDs 310 can be used as the optical sheet 330.

The reflective plate 340 reflects light from the plurality of the LEDs 310. The reflective plate 340 is disposed on the body 631 of the lower frame 630. The reflective plate 340 consists of for example a metal plate such as a steel plate or an aluminum plate. In this case, a white paint may be applied on a surface of the reflective plate 340.

The upper frame 610, the middle frame 620 and the lower frame 630 are fixed to each other by for example screws.

The upper frame 610 is a front frame that is the closest to the observer side among components of the frame 600. The upper frame 610 is for example a metallic frame formed into a rectangular framed shape in a planer view and formed into an L-shape in a sectional view. The metallic frame is made of a metallic material having high rigidity such as a steel plate or an aluminum plate. The upper frame 610 includes a peripheral part 611 and a sidewall part 612.

The peripheral part 611 is a bezel or flange which covers a display surface of the first display panel 100. Specifically, the peripheral part 611 is formed into framed shape so that the peripheral part 611 covers all of a peripheral edge of the first display panel 100. In this exemplary embodiment, the peripheral part 611 protrudes from an upper end of the sidewall part 612 in a direction parallel with the display surface of the first display panel 100. The peripheral part 611 is provided with a protrusion portion 611a protruding towards inner side in a direction orthogonal to the display surface of the first display panel 100. For example the protrusion portion 611a is formed by a drawing press processing.

An inner surface of an end portion of the peripheral part 611 is provided with a cushion member 613. The cushion member 613 is disposed between the peripheral part 611 and the first display panel 100. Specifically, the cushion member 613 is inserted so as to be sandwiched between the peripheral part 611 and the first polarizer 104. Owing to this, a space between the upper frame 610 and the first display panel 100 (the first polarizer 104) could be small, dust and insects could be prevented from entering inside the display device 1.

The sidewall part 612 protrudes downward from the peripheral part 611. The sidewall part 612 is positioned in sides of the first display panel 100, the second display panel 200 and the backlight 300. The sidewall part 612 faces the sidewall 622 of the middle frame 620.

The middle frame 620 is an intermediate frame disposed between the upper frame 610 and the lower frame 630. The middle frame 620 supports the first display panel 100 and the second display panel 200 from a backlight side. In this exemplary embodiment, the middle frame 620 is for example a metallic frame formed into a rectangular framed shape in a planer view and formed into an L-shape in a sectional view. The metallic frame is made of a metallic material having high rigidity such as a steel plate or an aluminum plate. The middle frame 620 includes a middle flange 621 and a sidewall 622.

The first display panel 100 and the second display panel 200 are sandwiched between the middle flange 621 and the peripheral part 611 of the upper frame 610. Specifically, the peripheral edges of the first display panel 100 and the second display panel 200 are positioned between the middle flange 621 and the peripheral part 611. The middle flange 621 is formed into a framed shape so that the middle flange 621 covers all of a rear surface of the peripheral edge of the second display panel 200.

An outer (upper) surface of an end portion of the middle flange 621 is provided with a cushion member 623. The cushion member 623 is disposed between the middle flange 621 and the second display panel 200. Specifically, the cushion member 623 is inserted so as to be sandwiched between the middle flange 621 and the second polarizer 204.

An inner (lower) surface of an end portion of the middle flange 621 is provided with a cushion member 624. The cushion member 624 is disposed between the middle flange 621 and the optical sheet 330.

The sidewall 622 protrudes downward from the middle flange 621. The sidewall 622 is positioned in sides of the backlight 300. The sidewall 622 is positioned between the sidewall part 612 of the upper frame 610 and the sidewall part 631b of the lower frame 630. The sidewall 622 faces the sidewall part 612 of the upper frame 610 and the sidewall part 631b of the lower frame 630.

The lower frame 630 is a rear frame disposed closer to a rear side (−direction of Z-axis) among components of the frame 600. The lower frame 630 accommodates the LEDs 310 of the backlight 300 and holds the transparent substrate 320, the optical sheet 330 and the reflective plate 340. In this exemplary embodiment, the lower frame 630 is for example a metallic housing generally shaped as a recess shape. The metallic housing is made of a metallic material having high rigidity such as a steel plate or an aluminum plate. The lower frame 630 includes a body 631 and a lower flange 632.

The body 631 constitutes an accommodate space that accommodates a plurality of the LEDs 310. The body 631 includes a bottom (rear) plate 631a having a rectangular shape in a planner view, and a framed sidewall 631b protruding upward from a peripheral ends of the bottom plate 631a.

The lower flange 632 peripherally surrounds the body 631. In this exemplary embodiment, the lower flange 632 protrudes from an upper end of the sidewall 631b of the body 631 in a direction parallel with the display surface of the first display panel 100. Note that a cushion may be disposed between the lower flange 632 and a peripheral end of the transparent substrate 320.

As illustrated in FIG. 4, a plurality of upper spacers 710 are disposed between the upper frame 610 and the middle frame 620. The upper spacers 710 are sandwiched between the upper frame 610 and the middle frame 620, and retain a distance between the upper frame 610 and the middle frame 620. The upper spacers 710 also restrict the first display panel 100 and the second display panel 200 in an in-plane direction.

A plurality of lower spacers 720 are disposed between the middle frame 620 and the lower frame 630. The lower spacers 720 are sandwiched between the middle frame 620 and the lower frame 630, and retain a distance between the middle frame 620 and the lower frame 630. The lower spacers 720 also restrict the transparent substrate 320 in an in-plane direction.

For example, the upper spacers 710 and the lower spacers 720 are, but not limited to, resin moldings. For example, the upper spacers 710 and the lower spacers 720 may be made of metallic materials.

As illustrated in FIG. 5 which shows sectional view along with a longitudinal direction of the display device 1, the first source FPC 110 and the second source FPC 210 are disposed between the upper frame 610 and the middle frame 620. The first source FPC 110 is connected to a inner side of the first TFT substrate 101 of the first display panel 100, and the second source FPC 210 is connected to a inner side of the second TFT substrate 201 of the second display panel 200. The inner side of the first TFT substrate 101 faces the first opposed substrate 102, and the inner side of the second TFT substrate 201 faces the second opposed substrate 202.

The first source FPC 110 is apart from the second source FPC 210 while at least part of the first source FPC 110 overlaps the second source FPC 210 in plan view. In this exemplary embodiment, almost all of the first source FPC 110 overlaps almost all of the second source FPC 210 in plan view.

The first source driver 111 outputting a drive signal to the first display panel 100 is mounted on the first source FPC 110. The second source driver 211 outputting a drive signal to the second display panel 200 is mounted on the second source FPC 210.

In this exemplary embodiment, the first source FPC 110 is connected to the first display panel 100 so that the first source driver 111 is on a surface of the first source FPC 110, which faces the second source FPC 210. The second source FPC 210 is connected to the second display panel 200 so that the second source driver 211 is on a surface of the second source FPC 210, which faces the first source FPC 110. That is to say, the first source driver 111 and the second source driver 211 are placed at an inner side, between the first source FPC 110 and the second source FPC 210.

With this layout, a conductive pattern of the first source FPC 110 is closer to the second source FPC 210 than a base substrate of the first source FPC 110 is, while a conductive pattern of the second source FPC 210 is closer to the first source FPC 110 than a base substrate of the second source FPC 210 is. That is to say, the conductive patterns of the first source FPC 110 and the conductive patterns of the second source FPC 210 are placed at the inner side, between the first source FPC 110 and the second source FPC 210. In other words, the conductive pattern of the first source FPC 110 is on a surface of the first source FPC 110, which faces the second source FPC 210 while the conductive pattern of the second source FPC 210 is on a surface of the second source FPC 210, which faces the first source FPC 110.

Each of the first source FPC 110 and the second source FPC 210 is curved along with the upper frame 610 and the middle frame 620. Both have a L-shape in a cross sectional view. Specifically, the first source FPC 110 and the second source FPC 210 are bent while being placed between the peripheral part 611 of the upper frame 610 and the middle flange 621 of the middle frame 620, as well as between the sidewall part 612 of the upper frame 610 and the sidewall part 622 of the middle frame 620.

In this case, the first source FPC 110 and the second source FPC 210 are bent so that the second source FPC 210 is placed on an inner side compared to the first source FPC 110.

The first source FPC 110 is in contact with the protrusion portion 611a of the peripheral part 611 of the upper frame 610. Specifically, a surface of the first source FPC 110, which is on an opposite side of a surface on which the first source driver 111 is mounted, is in contact with the protrusion portion 611a. Due to this, heat generated from the first source driver 111 can efficiently dissipate in the upper frame 610 via the protrusion portion 611a.

The second source FPC 210 is in contact with the heat conductive sheet 625 disposed on the middle flange 621 of the middle frame 620. Specifically, a surface of the second source FPC 210, which is on an opposite side of a surface on which the second source driver 211 is mounted, is in contact with the heat conductive sheet 625. Due to this, heat generated from the second source driver 211 can efficiently dissipate in the middle frame 620 via the heat conductive sheet 625.

The display device 1 further includes a compressible electrically insulating material 810. In this exemplary embodiment, the elastic insulating material 810 is made of an elastic insulating sheet. The insulating sheet 810 is disposed around a long edge of the display device 1. The insulating sheet 810 is disposed between the first source FPC 110 and the second source FPC 210 which are disposed around the long edge of the display device 1. The insulating sheet 810 is placed at least between the first source driver 111 and the second source driver 211. In this exemplary embodiment, the insulating sheet 810 covers the second source driver 211.

The insulating sheet 810 functions as a sheet cushion member having insulating properties. Therefore, when the insulating sheet 810 comes into contact with the first source driver 111 and/or the second source driver 211, or comes into contact with the first source FPC 110 and/or the second source FPC 210, the insulating sheet 810 could prevent the first source driver 111 and the second source driver 211 from being damaged, or prevent the first source FPC 110 and the second source FPC 210 from being damaged.

For example, the insulating sheet 810 is made from insulating resin materials having a closed-cell structure such as urethane, polyethylene foam and sponge, or elastomers such as silicon rubber. But the insulating sheet 810 is not limited to these materials. The insulating sheet 810 can be made from various materials having insulating properties and cushion properties.

Thus, the display device 1 according to this exemplary embodiment includes the elastic insulating sheet 810 disposed between the first source driver 111 on the first source FPC (first flexible substrate) 110 and the second source driver 211 on the second source FPC (second flexible substrate) 210.

With this structure, even if the first source FPC 110 and the second source FPC 210 overlap each other, the first source driver 111 can be prevented from being in contact with the second source FPC 210 because the first source driver 111 is isolated from the second source FPC 210 by the insulating sheet 810. Therefore, the second source FPC 210 can be prevented from being disconnected due to a contact between the first source driver 111 and the second source FPC 210.

Also, the second source driver 211 can be prevented from being in contact with the first source FPC 110 because the second source driver 211 is isolated from the first source FPC 110 by the insulating sheet 810. Therefore, the first source FPC 110 can be prevented from being disconnected due to a contact between the second source driver 211 and the first source FPC 110.

In this exemplary embodiment, the insulating sheet 810 does not have adhesiveness. Therefore, the insulating sheet 810 has a smooth surface. Thus, the insulating sheet 810 will not adhere to the first source FPC 110, the first source driver 111, the second source FPC 210 and the second source driver 211.

That is to say, the insulating sheet 810 is not attached to the first source FPC 110 nor the second source FPC 210. Thus, conductive patterns (lines) of the first source FPC 110 and the second source FPC 210 will not be disconnected. The following explains this point in detail.

If the insulating sheet 810 is attached to the first source FPC 110 or the second source FPC 210, when an ambient temperature around the first source FPC 110 and the second source FPC 210 changes due to operation of the display device 1, a difference in thermal expansion or contraction between the insulating sheet 810 and the first source FPC 110 or the second source FPC 210 occurs because of a difference in a linear expansion coefficient between the insulating sheet 810 and the first source FPC 110 or the second source FPC 210. Then, a stress according to the difference of the linear expansion coefficient occurs in the first source FPC 110 or the second source FPC 210. This can cause conductive patterns of the first source FPC 110 and the second source FPC 210 to be disconnected. In this regard, according to this exemplary embodiment, because the insulating sheet 810 is not attached to the first source FPC 110 or the second source FPC 210, conductive patterns of the first source FPC 110 and the second source FPC 210 can be prevented from being disconnected due to a stress caused by the differences of linear expansion coefficients.

In this exemplary embodiment, the insulating sheet 810 is attached to the second circuit board 212 that is connected to the second source FPC 210. Specifically, the insulating sheet 810 is attached to the second circuit board 212 in a cantilever state. That is to say, one end of the insulating sheet 810 is a fixed end connected to the second source FPC 210, while the other end of the insulating sheet 810 is free end and not connected anywhere. The insulating sheet 810 and the second circuit board 212 are attached to each other through an adhesion material. Parts of the insulating sheet 810 except the part adhered to the second circuit board 212 are not fixed and are free for flexible movement.

Thus, in this exemplary embodiment, the insulating sheet 810 is attached to the second circuit board 212 in a cantilever state.

With this structure, while the insulating sheet 810 covers the first source driver 111 and the second source driver 211, the insulating sheet 810 can easily be mounted without being attached to the first source FPC 110 and the second source FPC 210. That is to say, the insulating sheet 810 can be unconstrained by the first source FPC 110 and the second source FPC 210.

In addition, the insulating sheet 810 does not overlap with the first display panel 100 and the second display panel 200. Although the insulating sheet 810 extends from the second circuit board 212 towards the first display panel 100 and the second display panel 200, and extends beyond the first source driver 111 and the second source driver 211, the other end (free end) of the insulating sheet 810 does not reach the first display panel 100 and the second display panel 200.

That is to say, since the first source FPC 110 and the second source FPC 210 are attached to the first display panel 100 and the second display panel 200 respectively, if the other end of the insulating sheet 810 reached the first display panel 100 or the second display panel 200, it is possible that the first source FPC 110 would peel off from the first display panel 100 or the second source FPC 210 peel off from the second display panel 200 because a stress is concentrated on an adhesive area between the first display panel 100 and the first source FPC 110 or an adhesive area between the second display panel 200 and the second source FPC 210 due to a movement of the insulating sheet 810. Contrary to this, when the insulating sheet 810 does not overlap with the first display panel 100 and the second display panel 200, the first source FPC 110 can be prevented from peeling off from the first display panel 100 and the second source FPC 210 can be prevented from peeling off from the second display panel 200 because stresses on an adhesive area between the first display panel 100 and the first source FPC 110 or an adhesive area between the second display panel 200 and the second source FPC 210 can be reduced even if the insulating sheet 810 moves.

In this exemplary embodiment, as illustrated in FIG. 5, the first source FPC 110 and the second source FPC 210 are bent so that the second source FPC 210 is placed on an inner side compared to the first source FPC 110. A conductive pattern of the second source FPC 210 is closer to the first source FPC 110 than a base substrate of the second source FPC 210 is.

When such a first source FPC 110 and a second source FPC 210 are bent, and a stress occurs in a conductive pattern of the second source FPC 210, then the conductive pattern of the second source FPC 210 is more easily disconnected.

In this case, the insulating sheet 810 is attached to the first source FPC 110 or the second source FPC 210, and the conductive pattern of the second source FPC 210 is more easily disconnected because of a difference in thermal expansion or contraction between the insulating sheet 810 and the first source FPC 110 or the second source FPC 210. In this regard, according to this exemplary embodiment, because the insulating sheet 810 is not attached to the first source FPC 110 or the second source FPC 210, the conductive pattern of the second source FPC 210 can be prevented from being disconnected because the difference in thermal expansion or contraction between the insulating sheet 810 and the first source FPC 110 or the second source FPC 210 does not matter.

In this exemplary embodiment, the first TFT substrate 101 of the first display panel 100 faces the second TFT substrate 201 of the second display panel 200, and the first source FPC 110 is connected to an inner side of the first TFT substrate 101 of the first display panel 100, and the second source FPC 210 is connected to an inner side of the second TFT substrate 201 of the second display panel 200.

With this, the first source FPC 110 and the second source FPC 210 can be easily attached to the first display panel 100 and the second display panel 200, respectively, in a state where the first source driver 111 and the second source driver 211 face each other.

Next, the first gate FPC 120 and the second gate FPC 220 which are placed along with a short edge of the display device 1 will be explained thereafter.

As illustrated in FIG. 6 which shows sectional view along with a lateral direction of the display device 1, the first gate FPC 120 and the second gate FPC 220 are disposed between the upper frame 610 and the middle frame 620. The first gate FPC 120 is connected to the inner side of the first TFT substrate 101 of the first display panel 100, and the second gate FPC 220 is connected to the inner side of the second TFT substrate 201 of the second display panel 200.

The first gate FPC 120 is apart from the second gate FPC 220 while at least part of the first gate FPC 120 overlaps the second gate FPC 220 in plan view. In this exemplary embodiment, almost all of the first gate FPC 120 overlaps almost all of the second gate FPC 220 in plan view.

The first gate driver 121 outputting a drive signal to the first display panel 100 is mounted on the first gate FPC 120. The second gate driver 221 outputting a drive signal to the second display panel 200 is mounted on the second gate FPC 220.

In this exemplary embodiment, the first gate FPC 120 is connected to the first display panel 100 so that the first gate driver 121 is on a side of the second gate FPC 220. The second gate FPC 220 is connected to the second display panel 200 so that the second gate driver 221 is on a side of the first gate FPC 120. That is to say, the first gate driver 121 and the second gate driver 221 are placed in inner side, between the first gate FPC 120 and the second gate FPC 220.

With this layout, a conductive pattern of the first gate FPC 120 is closer to the second gate FPC 220 than a base substrate of the first gate FPC 120 is, while a conductive pattern of the second gate FPC 220 is closer to the first gate FPC 120 than a base substrate of the second gate FPC 220 is. That is to say, each of the conductive patterns of the first gate FPC 120 and the second gate FPC 220 is placed in inner side, between the first gate FPC 120 and the second gate FPC 220.

Similar to the first source FPC 110, the first gate FPC 120 is in contact with the protrusion portion 611a of the peripheral part 611 of the upper frame 610. Specifically, a surface of the first gate FPC 120, which is on an opposite side of a surface on which the first gate driver 121 is mounted, is in contact with the protrusion portion 611a. With this, heat generated from the first gate driver 121 can efficiently dissipate in the upper frame 610 via the protrusion portion 611a.

Similar to the second source FPC 210, the second gate FPC 220 is in contact with the heat conductive sheet 625 disposed on the middle flange 621 of the middle frame 620. Specifically, a surface of the second gate FPC 220, which is on an opposite side of a surface on which the second gate driver 221 is mounted, is in contact with the heat conductive sheet 625. With this, heat generated from the second gate driver 221 can efficiently dissipate in the middle frame 620 via the heat conductive sheet 625.

The display device 1 further includes an compressible electrically insulating sheet 820 disposed around the short edge of the display device 1. The insulating sheet 820 is a second insulating sheet disposed around the short edge of the display device 1. The insulating sheet 820 is disposed between the first gate FPC 120 and the second gate FPC 220 which are disposed around the short edge of the display device 1. The insulating sheet 820 is placed at least between the first gate driver 121 and the second gate driver 221. In this exemplary embodiment, the insulating sheet 820 covers the second source driver 211.

The insulating sheet 820 may be made from a same material of the insulating sheet 810. The insulating sheet 820 functions as a sheet cushion member having insulating properties. Therefore, in case the insulating sheet 820 is in contact with the first gate driver 121 and/or the second gate driver 221, or is in contact with the first gate FPC 120 and/or the second gate FPC 220, the insulating sheet 820 could prevent the first gate driver 121 and the second gate driver 221 from being damaged, or prevent the first gate FPC 120 and the second gate FPC 220 from being damaged.

Thus, the display device 1 according to this exemplary embodiment includes the elastic insulating sheet 820 disposed between the first gate driver 121 on the first gate FPC (first flexible substrate) 120 and the second gate driver 221 on the second gate FPC (second flexible substrate) 220.

With structure, even if the first gate FPC 120 and the second gate FPC 220 overlap to each other, the first gate driver 121 can be prevented from being in contact with the second gate FPC 220 because the first gate driver 121 is isolated from the second gate FPC 220 by the insulating sheet 820. Therefore, the second gate FPC 220 can be prevented from being disconnected due to a contact between the first gate driver 121 and the second gate FPC 220.

Also, the second gate driver 221 can be prevented from being in contact with the first gate FPC 120 because the second gate driver 221 is isolated from the first gate FPC 120 by the insulating sheet 820. Therefore, the first gate FPC 120 can be prevented from being disconnected due to a contact between the second gate driver 221 and the first gate FPC 120.

In this exemplary embodiment, the insulating sheet 820 does not have adhesiveness. Therefore, the insulating sheet 820 has a smooth surface. Thus, the insulating sheet 820 will not be adhere to the first gate FPC 120, the first gate driver 121, the second gate FPC 220 and the second gate driver 221.

That is to say, the insulating sheet 820 is not attached to the first gate FPC 120 nor the second gate FPC 220. Thus, conductive patterns (lines) of the first gate FPC 120 and the second gate FPC 220 will not be disconnected as explained above with reference to the insulating sheet 810, the first source FPC 110 and the second source FPC 210.

In this exemplary embodiment, the insulating sheet 820 is attached to the second display panel 200. Specifically, the insulating sheet 820 is attached to the second TFT substrate 201 of the second display panel 200 in a cantilever state. That is to say, one end of the insulating sheet 820 is a fixed end connected to the second TFT substrate 201, while the other end of the insulating sheet 820 is a free end not connected anywhere. For example, the insulating sheet 820 and the second TFT substrate 201 are attached to each other through an adhesion material.

First Modification

Figure 7:
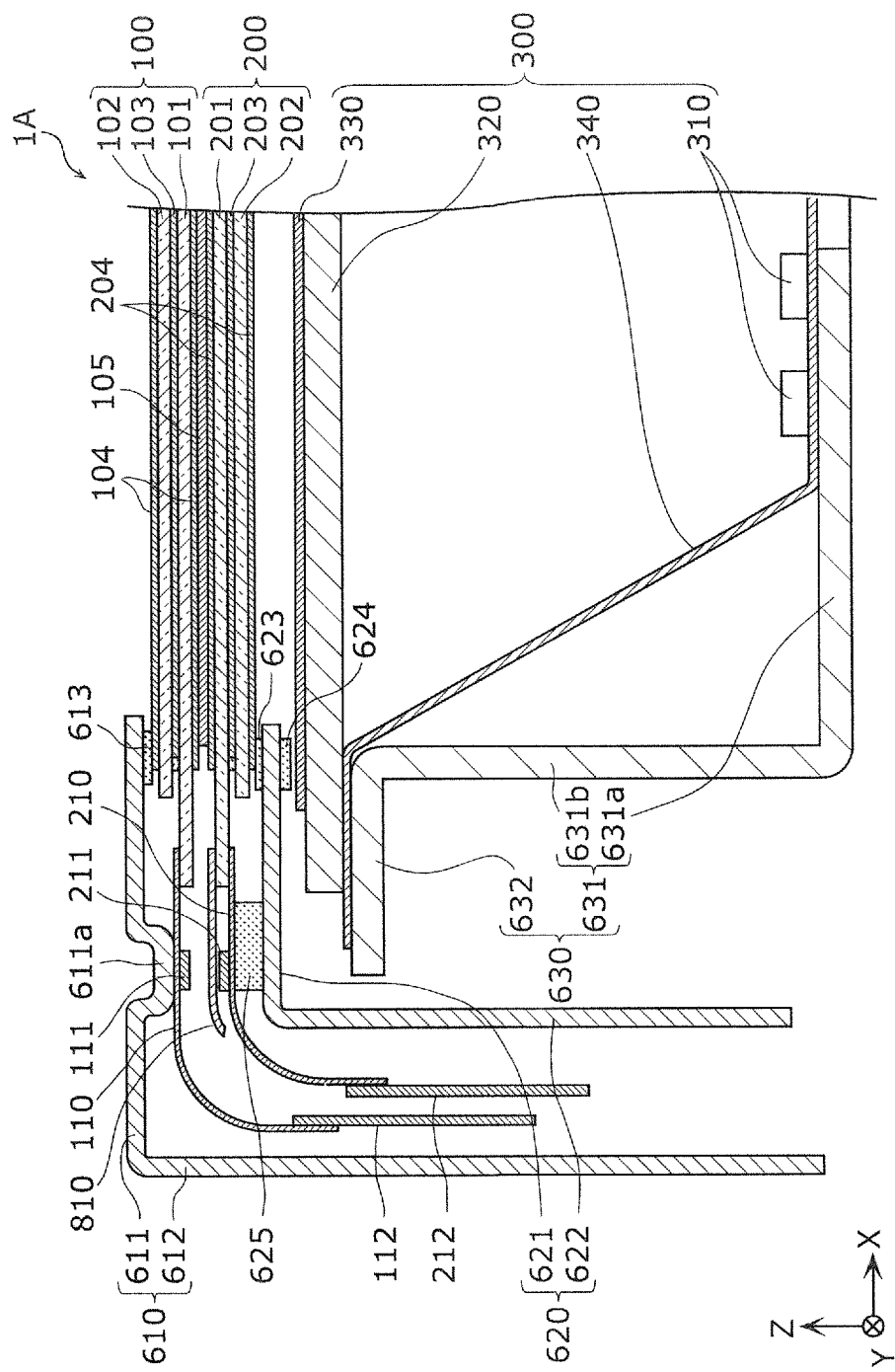
FIG. 7 is a partially sectional view of the liquid crystal display device according to a first modification.

A display device 1A according to a first modification will be described below with reference to FIG. 7. FIG. 7 corresponds to FIG. 5 and is a partially sectional view along with a long edge of the display device 1A.

Although the insulating sheet 810 is attached to the second circuit board 212 in the above exemplary embodiment as shown in FIG. 5, the insulating sheet 810 according to this modification, as shown in FIG. 7, is attached to the second display panel 200 like the insulating sheet 820 disposed in the short edge of the display device 1.

The insulating sheet 810 is attached to the second TFT substrate 201 of the second display panel 200 in a cantilever state. That is to say, one end of the insulating sheet 810 is a fixed end connected to the second TFT substrate 201, while the other end of the insulating sheet 810 is a free end not connected anywhere. For example, the insulating sheet 810 and the second TFT substrate 201 are attached to each other through an adhesion material.

Note that in the the display device 1A according to this modification, other structure except arrangement of the insulating sheet 810 is same as the display device 1 of the first exemplary embodiment.

The elastic insulating sheet 810 is disposed between the first source FPC 110 and the second source FPC 210. The insulating sheet 810 is placed at least between the first source driver 111 and the second source FPC 210, specifically, the insulating sheet 810 is placed between the first source driver 111 and the second source driver 211. The insulating sheet 810 covers the second source driver 211.

Owing to this structure, even if the first source FPC 110 and the second source FPC 210 overlap to each other, the first source driver 111 can be prevented from being in contact with the second source FPC 210 because the first source driver 111 is isolated from the second source FPC 210 by the insulating sheet 810. Therefore, the second source FPC 210 can be prevented from being disconnected due to a contact between the first source driver 111 and the second source FPC 210.

Also, the second source driver 211 can be prevented from being in contact with the first source FPC 110 because the second source driver 211 is isolated from the first source FPC 110 by the insulating sheet 810. Therefore, the first source FPC 110 can be prevented from being disconnected due to a contact between the second source driver 211 and the first source FPC 110.

Second Modification

Figure 8:
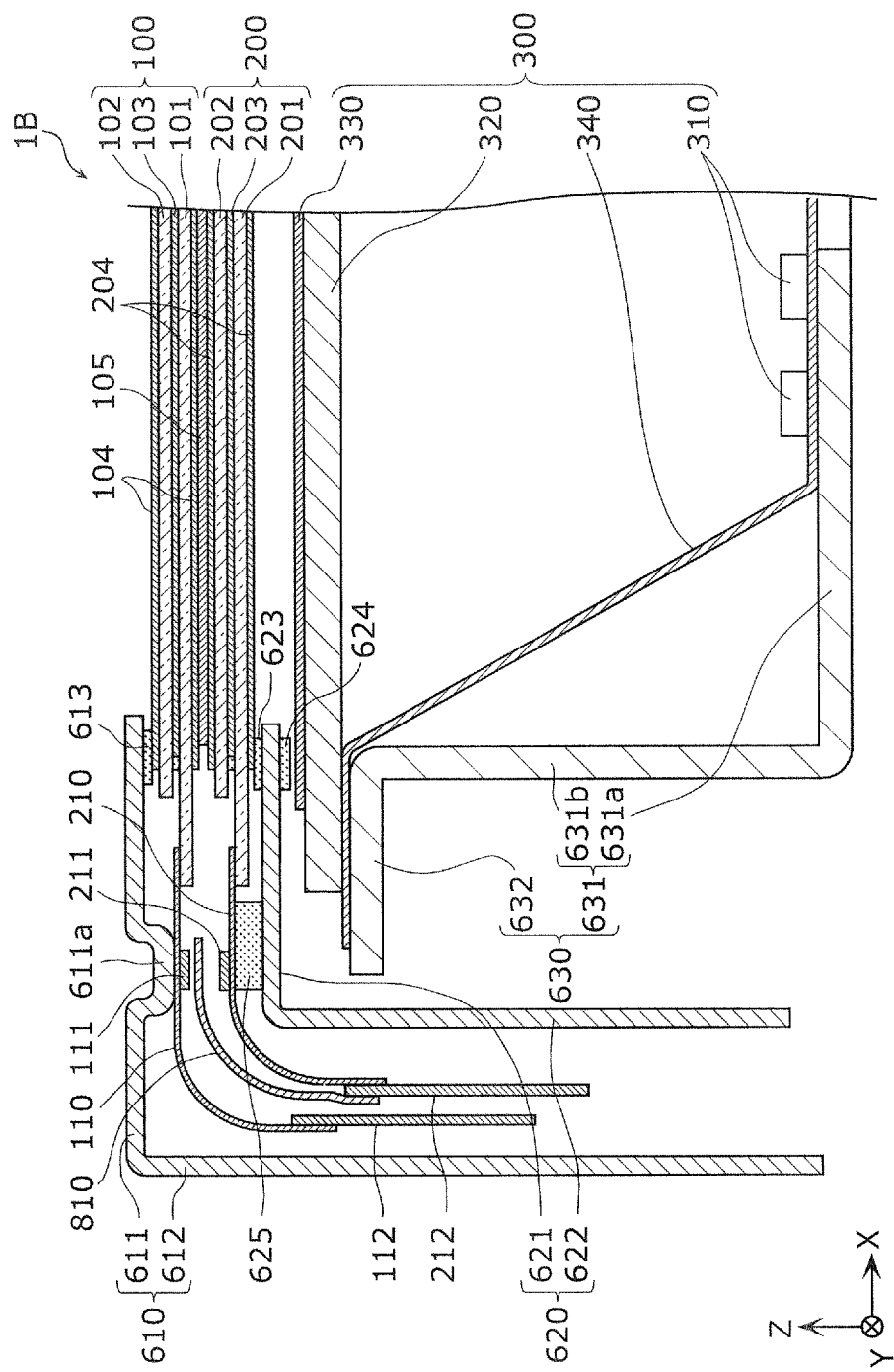
FIG. 8 is a partially sectional view of the liquid crystal display device according to a second modification.

Next, the display device 1B according to a second modification will be explained. FIG. 8 is a partially sectional view of the liquid crystal display device according to the second modification. FIG. 8 corresponds to FIG. 5 and show a sectional view along with a longitudinal edge of the display device 1B.

As shown in FIG. 5, in the the display device 1 disclosed above, the second display panel 200 is disposed such that the first TFT substrate and the first opposed substrate are inverted compared to the first display panel 100.

Contrary to this, as shown in FIG. 8, in the display device 1B, each of the first display panel 100 and the second display panel 200 has an opposed substrate disposed closer to an observer side and a TFT substrate disposed closer to the backlight side.

Also in this modification, the elastic insulating sheet 810 is disposed between the first source FPC 110 and the second source FPC 210. The insulating sheet 810 is placed at least between the first source driver 111 and the second source FPC 210, specifically, the insulating sheet 810 is placed between the first source driver 111 and the second source driver 211. The insulating sheet 810 covers the second source driver 211.

With this structure, even if the first source FPC 110 and the second source FPC 210 overlap to each other, the first source driver 111 can be prevented from being in contact with the second source FPC 210 because the first source driver 111 is isolated from the second source FPC 210 by the insulating sheet 810. Therefore, the second source FPC 210 can be prevented from being disconnected due to a contact between the first source driver 111 and the second source FPC 210.

Also, the second source driver 211 can be prevented from being in contact with the first source FPC 110 because the second source driver 211 is isolated from the first source FPC 110 by the insulating sheet 810. Therefore, the first source FPC 110 can be prevented from being disconnected due to a contact between the second source driver 211 and the first source FPC 110.

Third Modification

Figure 9:
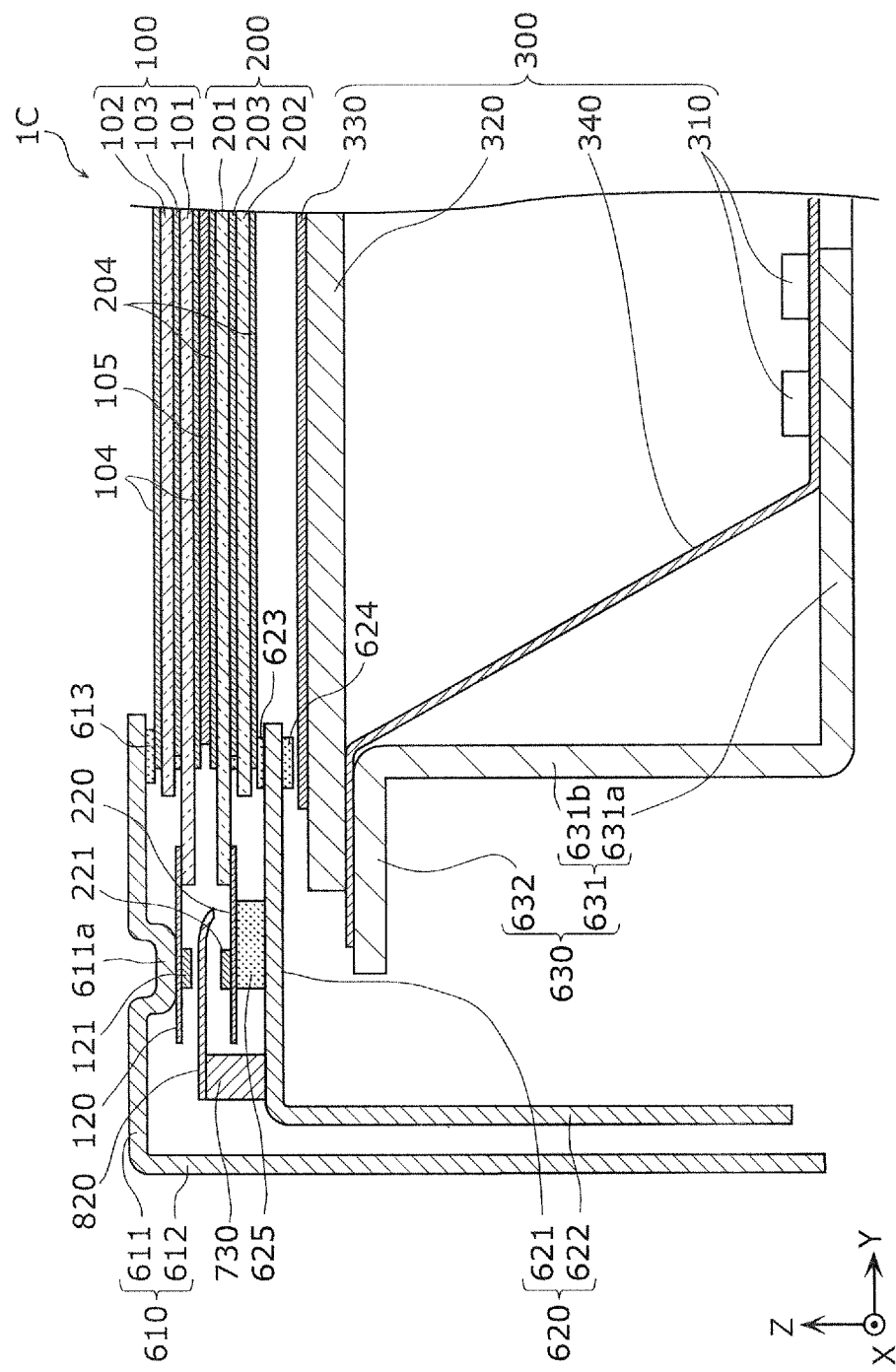
FIG. 9 is a partially sectional view of the liquid crystal display device according to a third modification.

A display device 1C according to a third modification will be described below with reference to FIG. 9. FIG. 9 corresponds to FIG. 6 and is a partially sectional view along with a short edge of the display device 1C.

As shown in FIG. 6, the display device 1 according to above exemplary embodiment, the insulating sheet 820 is attached to the second display panel 200.

Contrary to above, the display device 1C according to this modification, as shown in FIG. 9, the insulating sheet 820 is attached to a spacer 730 fixed to the middle flange 621 of the middle frame 620. Owing to the provision of the spacer 730, it is possible to adjust a position of the insulating sheet 820. For example, the spacer 730 is made from resin materials such as PET or metal materials such as Aluminum.

In the display device 1C according to this modification, the elastic insulating sheet 820 is disposed between the first gate FPC 120 and the second gate FPC 220. The insulating sheet 820 is placed at least between the first gate driver 121 and the second gate FPC 220, specifically, the insulating sheet 820 is placed between the first gate driver 121 and the second gate driver 221. The insulating sheet 820 covers the second gate driver 221.

Owing to this structure, even if the first gate FPC 120 and the second gate FPC 220 overlap to each other, the first gate driver 121 can be prevented from being in contact with the second gate FPC 220 because the first gate driver 121 is isolated from the second gate FPC 220 by the insulating sheet 820. Therefore, the second gate FPC 220 can be prevented from being disconnected due to a contact between the first gate driver 121 and the second gate FPC 220.

Also, the second gate driver 221 can be prevented from being in contact with the first gate FPC 120 because the second gate driver 221 is isolated from the first gate FPC 120 by the insulating sheet 820. Therefore, the first gate FPC 120 can be prevented from being disconnected due to a contact between the second gate driver 221 and the first gate FPC 120.

Note that the spacer 730 may be integral with the upper spacer 710. That is to say, the insulating sheet 820 is arranged by means of the upper spacer 710.

Figure 10:
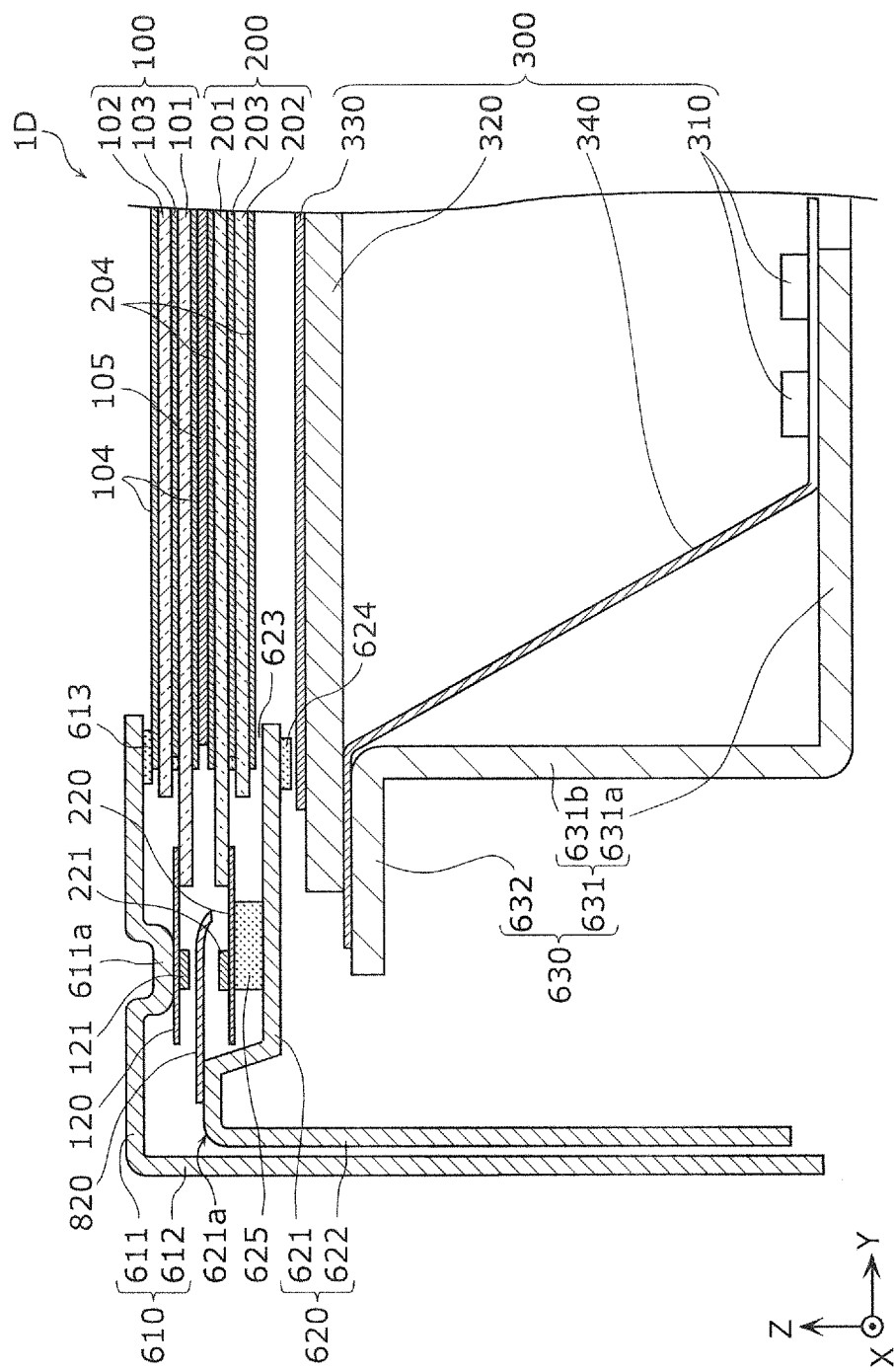
FIG. 10 is a partially sectional view of the liquid crystal display device according to a variation of the third modification.

Also, as shown in FIG. 10, the middle flange 621 of the middle frame 620 may be provided with a protrusion portion 621a instead of providing the spacer 730. For example the protrusion portion 621a is formed by a drawing press processing.

Other Modification

In the above exemplary embodiment and modifications, the first source driver 111 and the second source driver 211 overlap to each other, while the first gate driver 121 and the second gate driver 221 overlap to each other. However, the first source driver 111 and the second source driver 211 may not overlap to each other, and the first gate driver 121 and the second gate driver 221 may not overlap to each other. Owing to this structure, the first source driver 111 and the second source driver 211 can be prevented from being in contact with each other, as well as the first gate driver 121 and the second gate driver 221 can be prevented from being in contact with each other.

In the above exemplary embodiment, although the first display panel 100 and the second display panel 200 are liquid crystal displays, they are not limited to liquid crystal displays.

In the above exemplary embodiment, a quantum dot technology can apply to the backlight 300.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A display device comprising:
a first display panel;
a second display panel opposed to the first display panel;
a first flexible substrate on which a first driver IC outputting a driving signal to the first display panel is mounted;
a second flexible substrate being apart from the first flexible substrate and connected to the second display panel, at least a part of the second flexible substrate overlapping the first flexible substrate;
a flexible sheet of compressible insulating material disposed between the first flexible substrate and the second flexible substrate;
an upper frame that covers a display surface of the first display panel; and
a middle frame supporting the first display panel from a side opposite of the upper frame,
wherein the first flexible substrate is connected to the first display panel so that the first driver IC is on a side of the second flexible substrate,
the first flexible substrate and the second flexible substrate are disposed between the upper frame and the middle frame, and
the flexible sheet of compressible insulating material is disposed between the first driver IC and the second flexible substrate.

2. The display device according to claim 1, wherein
a circuit board is connected to at least one of the first flexible substrate and the second flexible substrate, and
the flexible sheet of compressible insulating material is attached to the circuit board in a cantilever state.

3. The display device according to claim 2, wherein
the circuit board is connected to the second flexible substrate.

4. The display device according to claim 1, wherein
a second driver IC is mounted on the second flexible substrate, and
the flexible sheet of compressible insulating material covers the second driver IC.

5. The display device according to claim 4, wherein
the first driver IC and the second driver IC are not overlapped to each other in a direction normal to the first flexible substrate.

6. The display device according to claim 1, wherein
the flexible sheet of compressible insulating material does not overlap with the first display panel.

7. The display device according to claim 1, wherein
the first flexible substrate and the second flexible substrate are bent so that the second flexible substrate is placed on an inner side of the first flexible substrate.

8. The display device according to claim 7, wherein
a conductive pattern of the second flexible substrate is on a surface of the second flexible substrate, the surface facing the first flexible substrate.

9. The display device according to claim 1, wherein
each of the first display panel and the second display panel includes a TFT substrate having a drive circuit layer and an opposed substrate opposing to the TFT substrate,
the TFT substrate of the first display panel faces the TFT substrate of the second display panel,
the first flexible substrate is connected to an inner side of the TFT substrate of the first display panel, and
the second flexible substrate is connected to an inner side of the TFT substrate of the second display panel.

10. The display device according to claim 1, wherein
the first display panel is sandwiched between the upper frame and the middle frame.

11. The display device according to claim 1, wherein
the upper frame includes a peripheral part that covers the display surface of the first display panel, and a sidewall part that protrudes from the peripheral part,
the middle frame includes a middle flange that supports the first display panel from the side opposite of the upper frame, and a sidewall that protrudes from the middle flange of the middle frame along the sidewall part of the upper frame, and
the first driver IC is disposed between the peripheral part of the upper frame and the middle flange of the middle frame.

12. The display device according to claim 11, wherein
the first display panel is sandwiched between the peripheral part of the upper frame and the middle flange of the middle frame.

13. The display device according to claim 1, further comprising
a lower frame that accommodates a plurality of LEDs,
wherein the middle frame is disposed between the upper frame and the lower frame.

14. The display device according to claim 1, wherein
a second driver IC is mounted on the second flexible substrate, and
a part of the flexible sheet of compressible insulating material is between the first driver IC and the second driver IC.

15. The display device according to claim 14, wherein
the second driver IC is on a side of the first flexible substrate.

16. The display device according to claim 1, wherein the flexible sheet of compressible insulating material has a free end configured to be flexibly movable relative to the second flexible substrate.

* * * * *